US009326066B2

(12) United States Patent
Klippel

(10) Patent No.: US 9,326,066 B2
(45) Date of Patent: Apr. 26, 2016

(54) ARRANGEMENT AND METHOD FOR CONVERTING AN INPUT SIGNAL INTO AN OUTPUT SIGNAL AND FOR GENERATING A PREDEFINED TRANSFER BEHAVIOR BETWEEN SAID INPUT SIGNAL AND SAID OUTPUT SIGNAL

(71) Applicant: Wolfgang Klippel, Dresden (DE)

(72) Inventor: Wolfgang Klippel, Dresden (DE)

( * ) Notice: Subject to any disclaimer, the term of this patent is extended or adjusted under 35 U.S.C. 154(b) by 74 days.

(21) Appl. No.: 14/449,379

(22) Filed: Aug. 1, 2014

(65) Prior Publication Data

US 2015/0036831 A1 Feb. 5, 2015

(30) Foreign Application Priority Data

Aug. 1, 2013 (DE) ........................ 10 2013 012 811

(51) Int. Cl.
*H03G 11/00* (2006.01)
*H04R 3/00* (2006.01)
*H04R 11/00* (2006.01)

(52) U.S. Cl.
CPC ................ *H04R 3/007* (2013.01); *H04R 11/00* (2013.01)

(58) Field of Classification Search
CPC .................................. H04R 3/007; H03F 1/52
USPC ........................................................... 381/55
See application file for complete search history.

(56) References Cited

U.S. PATENT DOCUMENTS 4,709,391 A 11/1987 Kaizer et al.
5,438,625 A 8/1995 Klippel
5,523,715 A 6/1996 Schrader
5,528,695 A * 6/1996 Klippel .................. H04R 3/002 330/278
5,825,901 A * 10/1998 Hisey ..................... H02K 26/00 318/119
6,269,318 B1 7/2001 Geddes
6,931,135 B1 8/2005 Kohut
7,372,966 B2 5/2008 Bright
8,019,088 B2 9/2011 Holman

FOREIGN PATENT DOCUMENTS

DE 4336608 A1 5/1995
DE 10 2007 005 070 A1 8/2008
DE 10 2012 020 271 A1 4/2014
EP 2 398 253 A1 12/2011
EP 2 453 670 A1 5/2012
WO 2005/091672 A1 9/2005
WO 2011/076288 A1 6/2011

OTHER PUBLICATIONS

German Office Action for German Patent Application No. 10 2013 012 811.0, dated Dec. 23, 2013, 18 pages.

* cited by examiner

*Primary Examiner* — Simon King
(74) *Attorney, Agent, or Firm* — Westman, Champlin & Koehler, P.A.

(57) ABSTRACT

An arrangement and method for converting an input signal z(t) into a mechanical or acoustical output signal p(t) comprising an electro-magnetic transducer using a coil at a fixed position and a moving armature, a sensor, a parameter measurement device and a controller. The parameter measurement device identifies parameter information P of an nonlinear model of the transducer considering and the saturation and the geometry of the magnetic elements. A diagnostic system reveals the physical causes of signal distortion and generates information for optimizing the design and manufacturing process of this transducer. The controller compensates for nonlinear signal distortion, stabilizes the rest position of the armature and protects the transducer against mechanical and thermal overload.

25 Claims, 12 Drawing Sheets

ARRANGEMENT AND METHOD FOR CONVERTING AN INPUT SIGNAL INTO AN OUTPUT SIGNAL AND FOR GENERATING A PREDEFINED TRANSFER BEHAVIOR BETWEEN SAID INPUT SIGNAL AND SAID OUTPUT SIGNAL

FIELD OF THE INVENTION

The invention generally relates to an Arrangement and method for converting an input signal into an output signal and for generating a predefined transfer behavior between said input signal and said output signal.

BACKGROUND OF THE INVENTION

The invention generally relates to an arrangement and a method for identifying the parameters of a nonlinear model of an electro-magnetic transducer and for using this information to correct the transfer characteristics of this transducer between input signal v and output signal p by changing the properties of the electro-magnetic transducer in design, manufacturing and by compensating actively undesired properties of said transducer by electric control. The electro-magnetic transducer may be used as an actuator (e.g. loudspeaker) or as a sensor (e.g. microphone) having an electrical input or output, respectively.

Most loudspeakers, headphones and other electro-acoustical devices use an electro-dynamical transducer with a moving voice coil in a static magnetic field. Models have been developed for this kind of transducer which provide sufficient accuracy for measurement and control application, such as disclosed in U.S. Pat. Nos. 4,709,391, 5,438,625, 6,269,318, 5,523,715, DE 4336608, U.S. Pat. Nos. 5,528,695, 6,931,135, 7,372,966, 8,019,088, WO2011/076288A1, EP 1743504, EP 2453670, EP 2398253 and DE 10 2012 020 271.

Electro-magnetic transducers converting an electric signal into a mechanic signal and vice versa use a coil at a fixed position and a moving armature connected via a driving pin with a diaphragm. This kind of transducer has some desired properties (e.g. high efficiency) which are not found in electro-dynamical transducers. The nonlinearities inherent in the electro-magnetic principle are a source of signal distortion. This disadvantage can be partly reduced by using a "balanced" armature using additional magnets.

Straightforward distortion measurement techniques reveal harmonic distortion and other symptoms of nonlinearities inherent in this transducer. However, the results of these measurements do not give a complete description of the nonlinear transfer behavior but depend on the particular properties of the excitation stimulus. An accurate model of the electro-magnetic transducer is required to get a deeper insight in the physical causes and to predict the large signal performance for any input signal. The theory developed for electro-dynamical transducers is not applicable for electro-magnetic transducers. F. V. Hunt developed a first nonlinear model in "Electroacoustics—The Analysis of Transduction and Its Historical Background" (Acoustical Society of America, New York, 1954, 1982), which describes the electro-magnetic transducer by an electrical equivalent circuit comprising lumped elements. The inductance L(x), transduction factor T(x) and magnetic stiffness $K_{mag}(x)$ depend on the position x of the armature. This model was used by J. Jensen, et. al. in the paper "Nonlinear Time-Domain Modeling of Balanced-Armature Receivers," published in the J. Audio Eng. Soc. Vol. 59, No. 3, 2011 March to predict the generation of odd-order harmonic distortion by assuming a symmetrical rest position of the armature in the magnetic field. All parameters are derived from the geometry of an ideal transducer having a magnetic material without saturation and hysteresis. The prior art has not disclosed a measurement technique for identifying the free parameters of this model applicable to real transducers.

SUMMARY OF THE INVENTION

According to the present invention, the nonlinear model of the electro-magnetic transducer is extended to consider the saturation and hysteresis of the armature and other magnetic material. This extended model describes the dominant causes of nonlinear signal distortion in electro-magnetic transducers by using lumped parameters P such as coil inductance L(x,i), transduction factor T(x,i) and magnetic stiffness $K_{mm}(x,i)$ which are functions of the armature position x and current i. The nonlinear parameters correspond to a nonlinear flux function $f_L(x,i)$ which describes the magnetic flux $\phi_A$ in the armature.

The invention discloses a measurement technique which identifies all free parameters P of the extended model by monitoring at least one state variable of the transducer. The direct measurement of the armature position x or other mechanical or acoustical signals require a cost effective sensor. The hardware requirements can be reduced by monitoring an electrical signal at the terminals and by using the model for the identification of mechanical parameters. Optimal values of the free parameters P of the model are estimated by minimizing a cost function that describes the mean squared error between predicted and measured state variable. This measurement can be realized as an adaptive process while reproducing an arbitrary stimulus. The measurement is immune against ambient noise as found in a production environment or in the target application. The measurement technique evaluates the accuracy of the modeling by comparing the theoretical and real behavior of the transducer.

The extended model with identified parameters reveals the physical causes of the signal distortion and their relationship to geometry, material of the components and problems caused by the assembling process in manufacturing. There are two alternative ways to use this information for correcting the vibration and the transfer behavior of the transducer:

The parameters have a high diagnostic value for assessing design choices during the development process. The information is also useful for manufacturing and quality control. The offset $x_{off}=x_s-x_e$, for example, is a meaningful characteristic for adjusting armature's equilibrium position $x_e$.

Active control using electric means and signal processing is an alternative way to compensate undesired effects of the transducer nonlinearities. A control law is derived from the results of the physical modeling. The free parameters of the control law correspond to the parameters P which are permanently identified by the adaptive measurement technique. No human expert is required to ensure the optimal control while properties of the transducer are varying over time due to aging, fatigue of the unit, climate, load changes as well as other external influences.

The control system uses a state predictor to synthesize the states of the transducer under the condition that undesired nonlinear distortions are compensated in the output signal. This results in a control law with a feed-forward structure which is always stable. Any time delay may be added between the measurement system and the controller because the transferred parameter vector P changes slowly over time. The invention avoids any feedback of state variables from the measurement system to the controller.

The control system can also be used for generating a DC component at the terminals of the transducer which moves the armature actively to the symmetry point $x_s$ and reduces the offset $x_{off}$ actively. This feature is very important for stabilizing transducers which have a low mechanical stiffness and which are desired for closed-box systems with a small intended leakage to cope with static air pressure variations.

According to the invention the controller provides a protection against high amplitudes of the input signal causing a thermal and mechanical overload of the transducer which may cause excessive distortion in the output signal and a damage of the unit. The protection system uses the state vector x synthesized by a state predictor which corresponds to the state variables (e.g. armature position x, input current i) of the transducer to detect an overload situation. The limits of the permissible working range such as the maximal displacement $x_{lim}$ may be automatically derived from the parameter vector P provided by the measurement system.

These and other features, aspects and advantages of the present invention will become better understood with reference to the following drawings, description and claims.

DETAILED DESCRIPTION OF THE INVENTION

Figure 1:
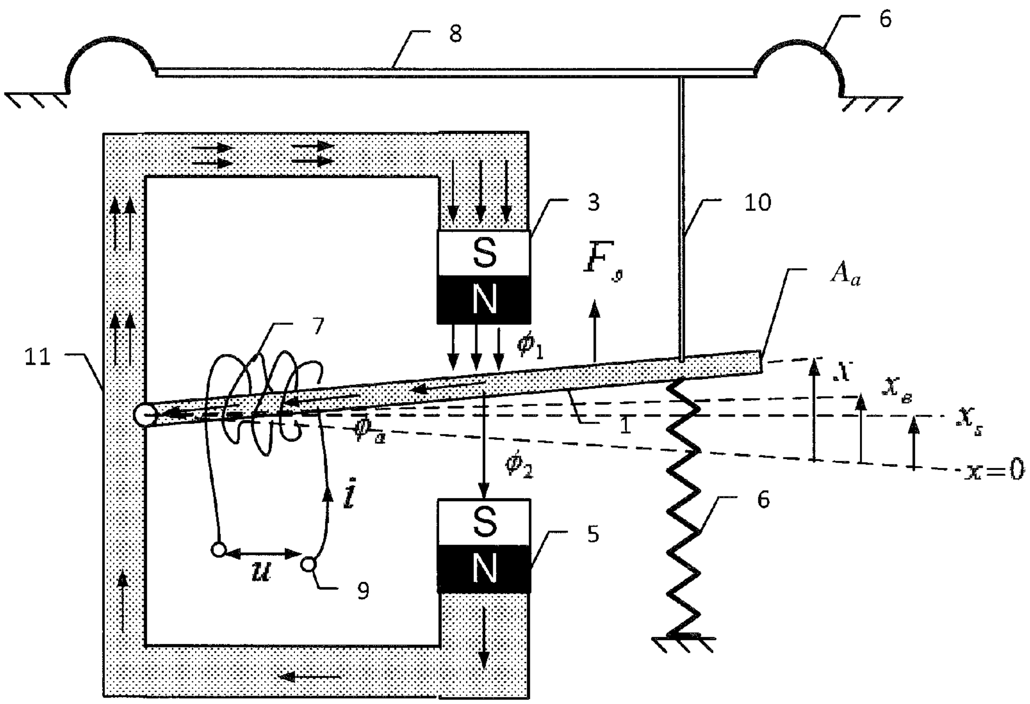
FIG. 1 is a sectional view of a balanced-armature transducer.

The derivation of the theory is illustrated by the example of the balanced-armature device as shown in FIG. 1 but may be applied to other types of the electro-magnetic transducer in a similar way. The armature 1 is placed in the air gap between the magnets 3 and 5 which are part of a magnetic circuit 11. A coil 7 placed at a fixed position generates a magneto-motive force Ni, depending on the number N of wire turns and input current i at the terminals 9. The mechanical suspension 6 determines the rest position of the armature and the driving rod 10 is connected to the diaphragm 8.

Figure 2:
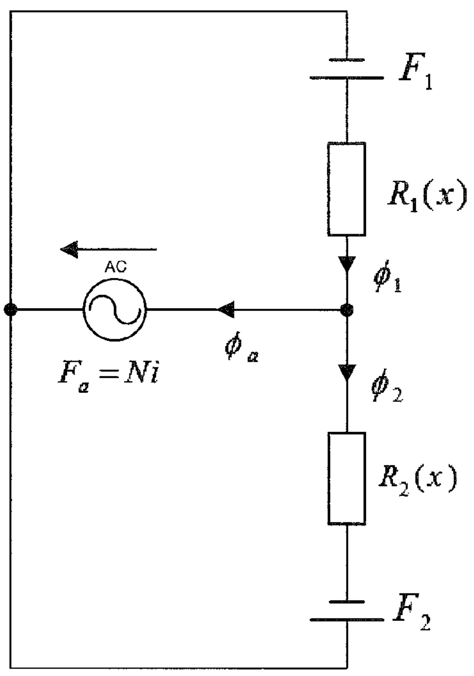
FIG. 2 shows a simplified magnetic circuit of the balanced-armature transducer.

The model, as disclosed by F. V. Hunt in the above mentioned prior art, is based on the assumptions that the magnets 3 and 5 have the same magneto-motive force $$F_m=F_1=F_2 \tag{1}$$

and the magnetic reluctances $R_1(x)$ and $R_2(x)$ of the air in the upper and lower gap are much larger than any other reluctance in the iron path giving the simplified magnetic circuit in FIG. 2. Then the magnet fluxes $\phi_1$ and $\phi_2$ in the upper and lower gap, respectively, can be described by $$Ni + F_m = \frac{\phi_1}{\rho_1(x)} \tag{2}$$

$$Ni - F_m = -\frac{\phi_2}{\rho_2(x)} \tag{3}$$

using the non-linear permeances $\rho_1(x)$ and $\rho_2(x)$ which are the inverse of the reluctances $R_1(x)$ and $R_2(x)$, respectively.

Figure 3:
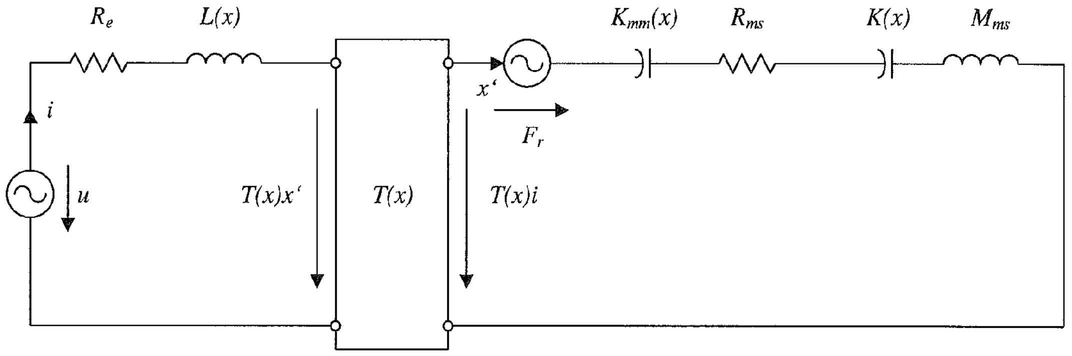
FIG. 3 shows a simplified model of the balanced-armature transducer using lumped parameters for modeling the electrical and mechanical components.

Assuming the armature 1 is symmetrically located at the initial rest position x=0 between the two demagnetized magnets, the resulting equilibrium point $x_e$ corresponds to the symmetry point $x_s$ after magnetizing the magnets. The permeances can be calculated by $$\rho_1(x) = \frac{1}{R_1(x)} = \frac{\mu_0 A}{D - x} = \frac{\mu_0 A}{D^2 - x^2}(D + x) \tag{4}$$

$$\rho_2(x) = \frac{1}{R_2(x)} = \frac{\mu_0 A}{D + x} = \frac{\mu_0 A}{D^2 - x^2}(D - x) \tag{5}$$

using the permeability $\mu_0$ of air, cross section area A and the length D of the two air gaps for x=0. This modeling leads to the electrical equivalent circuit of the balanced-armature transducer as shown in FIG. 3 comprising a transduction factor $$T(x) = \frac{2\mu_0 ANF_m}{D^2}\frac{x^2 + D^2}{(D^2 - x^2)^2}, \tag{6}$$

an additional magnetic stiffness $$K_{mm}(x) = -\frac{F_{mm}}{x} = \frac{2\mu_0 AF_m^2}{D}\frac{1}{(D^2 - x^2)^2} \tag{7}$$

and a coil inductance $$L(x) = \frac{2\mu_0 AN^2}{D}\frac{D^2}{D^2 - x^2}, \tag{8}$$

generating the reluctance force $$F_{rel} = -\frac{1}{2}i^2\frac{dL(x)}{dx}. \tag{9}$$

The magnetic stiffness $K_{mm}(x)$ is not found in the electrodynamic transducer and is a unique feature of the electromagnetic transducer. The moving mass $M_{ms}$, the electrical DC resistance $R_e$ of the coil and the mechanical resistance $R_{ms}$ representing the losses in the mechanical system are linear parameters which are constant.

Figure 4:
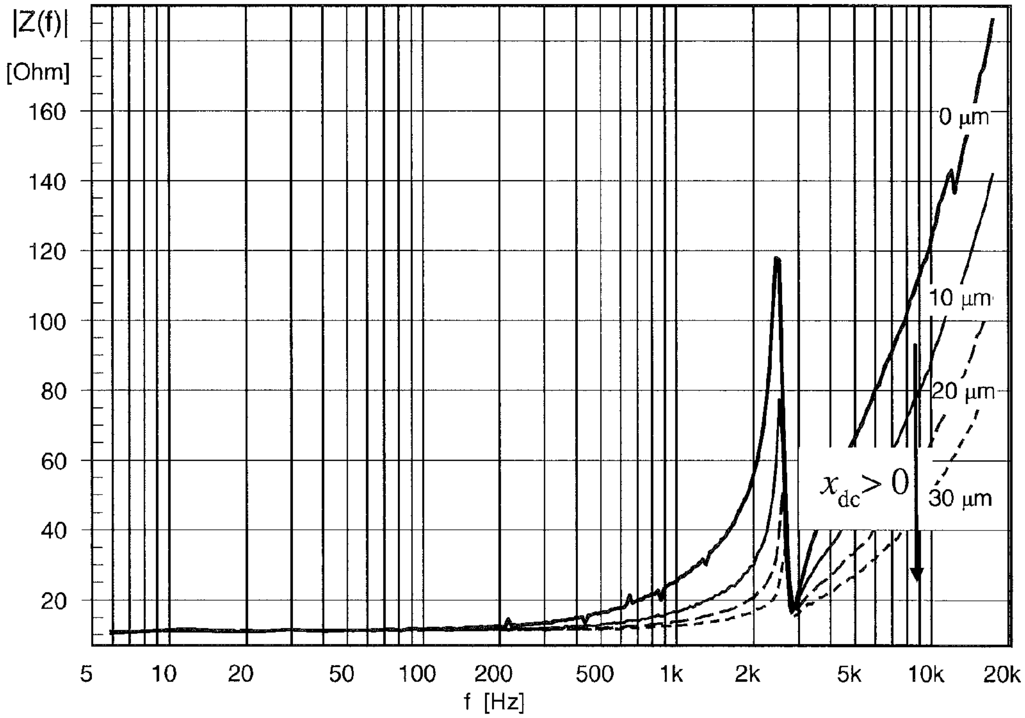
FIG. 4 shows the electric input impedance of a balanced-armature transducer measured with a superimposed positive DC displacement $X_{DC}$.
Figure 5:
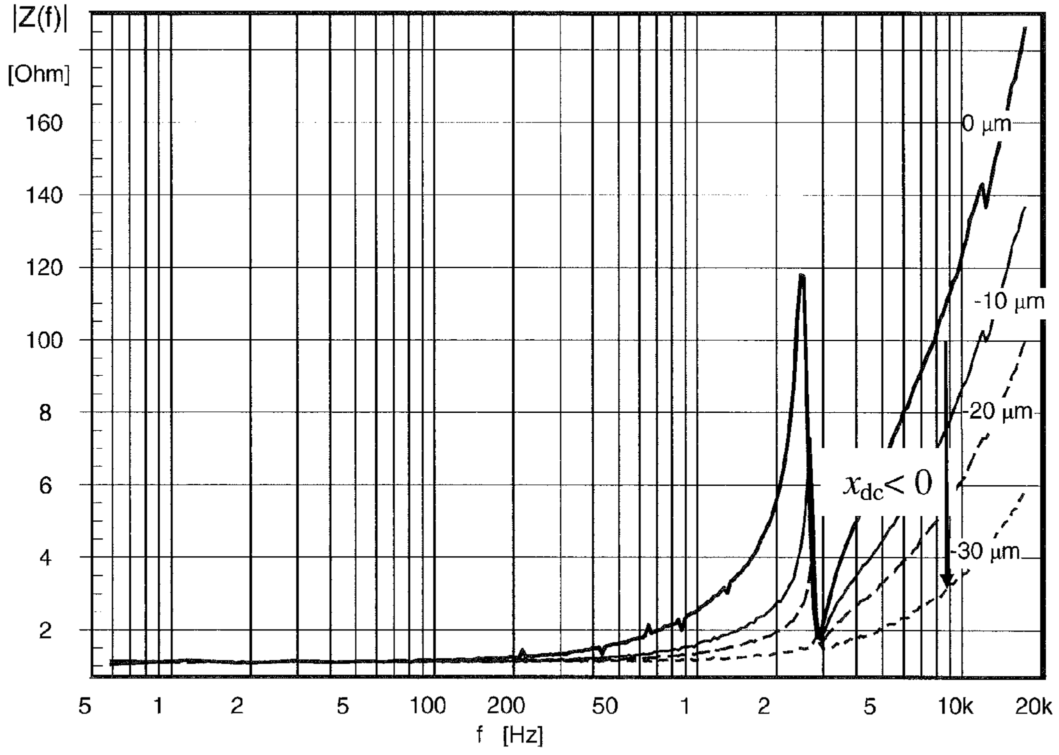
FIG. 5 shows the electric input impedance of a balanced-armature transducer measured with a superimposed negative DC displacement $x_{DC}$.

Due to the denominator in Eq. (8) the inductance L(x) and the electrical input impedance $Z_e(f)$ at higher frequencies f increases for positive and negative displacement x. However, the results of practical measurement on real transducers reveal an impedance maximum at the equilibrium position $x_e$ and a decrease of the impedance for positive and negative displacement as shown in FIG. 4 and FIG. 5. Furthermore, the simple theory developed by F. V. Hunt neglects any offset of the initial position x=0 from the symmetry point $x_s$ causing an asymmetry in the nonlinear parameter characteristics.

Figure 6:
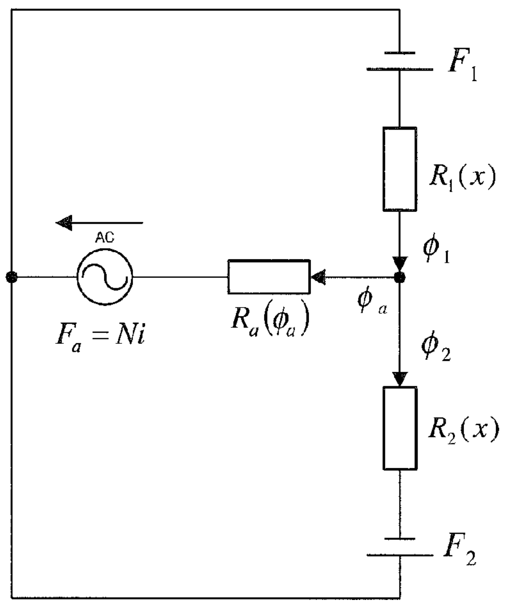
FIG. 6 shows a magnetic circuit of the balanced-armature transducer according to the present invention.

Contrary to the prior art the reluctance $R_a(\phi_a)=\rho_a(\phi_a)^{-1}$ representing the armature in the magnetic circuit as shown in FIG. 6 is a non-linear function depending on the magnetic flux $\phi_a$ corresponding to the fundamental equations $$\phi_a = \phi_1 - \phi_2 \tag{10}$$

$$Ni + F_m = \frac{\phi_1}{\rho_1(x)} + \frac{\phi_a}{\rho_a(\phi_a)} \tag{11}$$

$$Ni - F_m = -\frac{\phi_2}{\rho_2(x)} + \frac{\phi_a}{\rho_a(\phi_a)} \tag{12}$$

where x describes the absolute position of the armature. This position x=0 is determined by the mechanical suspension and describes the initial rest position of the armature with demagnetized magnets ($F_m$=0) and no input current i=0. After magnetizing the magnets 3 and 5 and having a magneto-motive force ($F_m$>0) the armature is moved to an equilibrium position $x_e$ where the magnetic DC force equals with the restoring force of the mechanical suspension. An input current i#0 generates a displacement $x-x_e$ of the armature.

The fluxes $\phi_1$ and $\phi_2$ in the upper and lower air gap, respectively, can be expressed by $$\phi_1 = \rho_1(x)(F_m + Ni) - \frac{\rho_1(x)}{\rho_a(\phi_a)}\phi_a \tag{13}$$

$$\phi_2 = \rho_2(x)(F_m - Ni) + \frac{\rho_2(x)}{\rho_a(\phi_a)}\phi_a. \tag{14}$$

The nonlinear functions of the permeances can be modeled by $$\rho_1(x) = \frac{1}{R_1(x)} = \frac{\mu_0 A}{D-(x-x_s)} = \frac{\mu_0 A}{D^2-(x-x_s)^2}(D+(x-x_s)) \tag{15}$$

$$\rho_2(x) = \frac{1}{R_2(x)} = \frac{\mu_0 A}{D+(x-x_s)} = \frac{\mu_0 A}{D^2-(x-x_s)^2}(D-(x-x_s)) \tag{16}$$

with the symmetry point $x_s$ describing the position x where the permeances of the upper and lower air gap are identical.

According to Eq. (10) the flux in the armature can be calculated as $$\begin{aligned}\phi_a &= \rho_1(x)(F_m + F_a) - \rho_2(x)(F_m - F_a) - \frac{\rho_1(x)+\rho_2(x)}{\rho_a(\phi_a)}\phi_a \\ &= \frac{2\mu_0 A}{D^2-(x-x_s)^2}\left(NDi + F_m(x-x_s) - \frac{D}{\rho_a(\phi_a)}\phi_a\right) \\ &= f_L(x, i)\frac{2\mu_0 A}{D^2}(NDi + F_m(x-x_s))\end{aligned} \tag{17}$$

with the nonlinear flux function $$f_L(x, i) = \frac{1}{1 - \frac{(x-x_s)^2}{D^2} + \frac{2\mu_0 A}{D}\frac{1}{\rho_a(\phi_a(x, i))}} \tag{18}$$

varying with the armature position x and the input current i.

This function can be approximated by a series expansion $$f_L(x, i) = \frac{1}{1 - \left(\frac{x-x_s}{D}\right)^2 + \sum_{k=1}^{K} s_k\left(i + s_x\left(\frac{x-x_s}{D}\right)\right)^{2k}} \tag{19}$$

with the coefficients $s_k$ describing the saturation of the magnetic material and the parameter $s_x$ describing the dependency on armature position x. The first nonlinear term in the denominator represents the geometrical nonlinearity of the transducer and generates high values of $f_L(x,i)$ when $x-x_s$ approaches ±D and the saturation is negligible ($s_k$=0 for all k). The second term $$\frac{2\mu_0 A}{D}\frac{1}{\rho_a(\phi_a)} > \frac{(x-x_s)^2}{D^2} \tag{20}$$

in the denominator representing the saturation becomes dominant in most transducers and the flux function decreases. If the parameter $s_x$ is high, the saturation generated by position x of the armature may compensate the effect of the geometrical non-linearity in the first term of the denominator.

Figure 7:
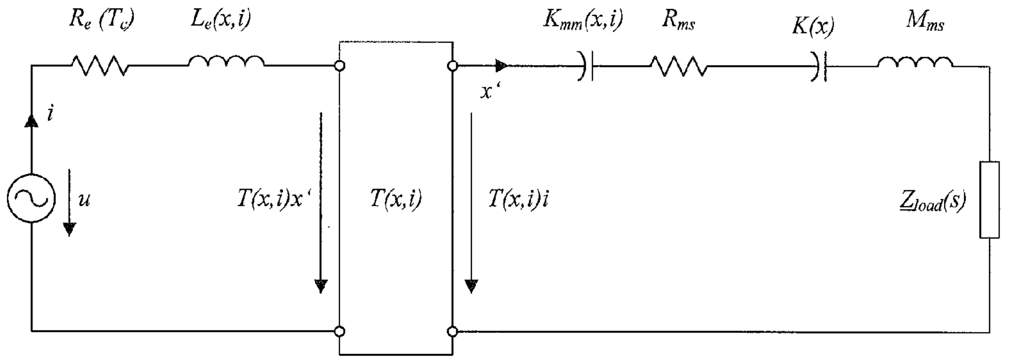
FIG. 7 shows an extended model of the balanced-armature transducer using lumped parameters for modeling the electrical and mechanical components according to the current invention.

The electrical mesh on the left-hand side of the equivalent circuit in FIG. 7 corresponds to $$\begin{aligned}u &= R_e i + N\frac{d\phi_a}{dt} = R_e i + N\frac{d\left(\frac{2\mu_0 A}{D^2}f_L(x, i)(NDi + F_m(x-x_s))\right)}{dt} \\ &= R_e i + \frac{d(L(x, i)i)}{dt} + T(x, i)\frac{dx}{dt}\end{aligned} \tag{21}$$

comprising nonlinear inductance $$L(x, i) = L(x_s, 0)f_L(x, i) \text{ with} \tag{22}$$

-continued $$L(x_s, 0) = L(x_s, i = 0) = \frac{2\mu_0 A N^2}{D} \tag{23}$$

and the electro-magnetic transduction factor $$T(x, i) \approx T(x_s, 0) f_L(x, i) = \frac{L(x_s, 0)}{\lambda} f_L(x, i) \text{ with} \tag{24}$$

$$\lambda = \frac{ND}{F_m}. \tag{25}$$

The sum of the fluxes $\phi_1 + \phi_2$ in both air gaps can be expressed by $$\begin{aligned} \phi_1 + \phi_2 &= \rho_1(x)(F_m + Ni) + \rho_2(x)(F_m - Ni) + (\rho_2(x) - \rho_1(x))\frac{\phi_a}{\rho_a(\phi_a)} \\ &= \frac{2\mu_0 A}{D^2 - (x - x_s)^2}\left(Ni(x - x_s) + DF_m - (x - x_s)\frac{\phi_a}{\rho_a(\phi_a)}\right). \end{aligned} \tag{26}$$

Under the assumption that the saturation of the flux in the armature is the dominant nonlinearity in accordance with Eq. (20), the approximation $$\frac{\phi_a}{\rho_a(\phi_a)} \approx Ni + \frac{F_m(x - x_s)}{D} \tag{27}$$

and Eq. (26) gives the sum flux $$\phi_1 + \phi_2 \approx \frac{2\mu_0 A}{D} F_m. \tag{28}$$

The total driving force can be expressed as $$\begin{aligned} F_\phi &= \frac{\phi_1^2 - \phi_2^2}{2\mu_0 A} = \frac{(\phi_1 + \phi_2)\phi_a}{2\mu_0 A} \\ &\approx \frac{2\mu_0 A F_m^2}{D^3} f_L(x, i)(x - x_s) + \frac{2\mu_0 A N F_m}{D^2} f_L(x, i) i \\ &= -K_{mm}(x, i)(x - x_s) + T(x, i) i, \end{aligned} \tag{29}$$

using the transduction factor T(x,i) according Eq. (24) and the magnetic stiffness $$K_{mm}(x, i) = -\frac{F_{mn}}{x} = -K_{mm}(x_s, 0) f_L(x, i) = -\frac{L(x_s, 0)}{\lambda^2} f_L(x, i). \tag{30}$$

The relationship between the forces in the mechanical system on the right-hand side of the equivalent circuit in FIG. 7 can be described by $$T(x,i)i = (K(x) - K(0))x + K_{mm}(x,i)(x - x_s) + L^{-1}[Z_m(s)s] * x, \tag{31}$$

using the inverse Laplace transformation $L^{-1}$[ ] and the convolution operator * to consider the mechanical impedance $$Z_m(s) = \frac{1}{K(0)} + R_{ms} + M_{ms}s + Z_{load}(s) \tag{32}$$

comprising the linear lumped parameters of the transducer and the impedance $Z_{load}(s)$ of the mechanic and acoustic load.

The equilibrium point $x_e$ of the armature can be found by $$(K(x_e) - K(0))x_e + K_{mm}(x_e, 0)(x_e - x_s) + L^{-1}[Z_m(s)s] * x_e = 0 \tag{33}$$

using Eq. (31) with input current i=0.

Contrary to the prior art the nonlinear inductance L(x,i), transduction factor T(x,i) and magnetic stiffness $K_{mm}$(x,i) are nonlinear functions of displacement x and current i. The differential equations of the balanced-armature transducer can be expressed as $$u = R_e i + L(x_s, 0)\frac{d(i \cdot f_L(x, i))}{dt} + \frac{L(x_s, 0)}{\lambda} f_L(x, i)\frac{dx}{dt} \tag{34}$$

$$\frac{L_e(x_s, 0)}{\lambda} f_L(x, i) i = (K(x) - K(0))x - \frac{L(x_s, 0)}{\lambda^2} f_L(x, i)(x - x_s) + L^{-1}[Z_m(s)s] * x. \tag{35}$$

After developing the stiffness K(x) of the mechanical suspension into a power series by $$K(x) = \sum_{k=0}^{K} k_k x^k, \tag{36}$$

the free parameters of the model $$P = [P_1 \ldots P_j \ldots P_j]^T = [P_{lin} P_{nlin}] = [P_{lin} P_{mag} P_{sus}] \tag{37}$$

comprise a linear parameter vector $$P_{lin} = \lfloor R_e M_{ms} L(x_{off}, 0) R_{ms} \lambda k_0 \rfloor \text{(38)}$$

and a nonlinear parameter vector $P_{nlin}$ which can be separated into parameters of the magnetic circuit $$P_{mag} = \lfloor x_{off} s_x D s_1 \ldots s_K \tag{39}$$

and parameters of the mechanic or acoustic suspension $$P_{sus} = [k_1 \ldots k_K]. \tag{40}$$

The nonlinear mechanical parameters $P_{sus}$ of the suspension are also found in an electro-dynamical loudspeaker. The nonlinear magnetic parameters $P_{nlin}$ are different from the inductance L(x,i) and the force factor Bl(x) found in a moving-coil transducer where the two parameters have a completely different curve shape. In a balanced-armature transducer the flux function $f_L$(x,i) generates a similar nonlinear curve shape of the inductance L(x,i), transduction factor T(x, i) and magnetic stiffness $K_{mm}$(x,i). The magnetic stiffness $K_{mm}$(x,i) generated in the magnetized transducer does not exist in electro-dynamical transducers.

Figure 8:
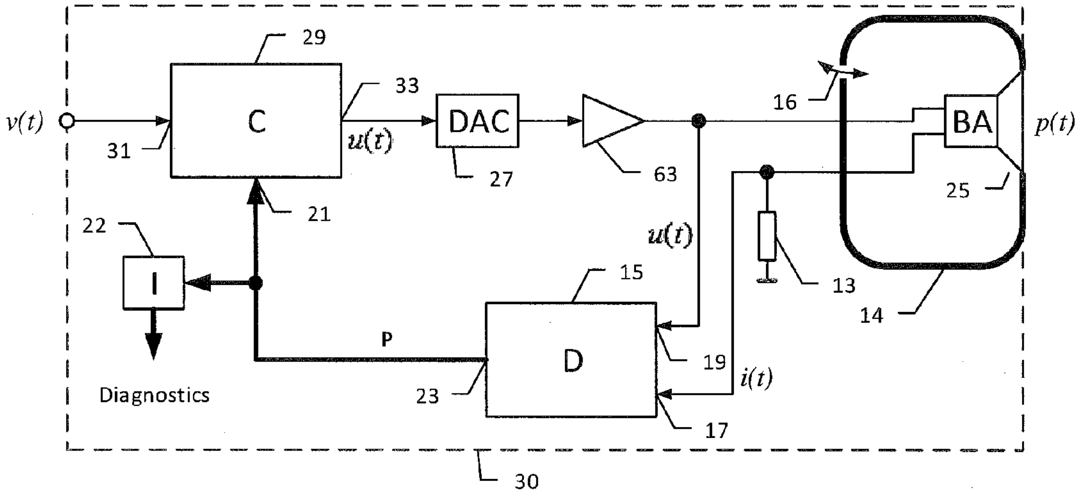
FIG. 8 shows a general identification and control system in accordance with the present invention.

The extended model of the electro-magnetic transducer is the basis for the arrangement 30 shown in FIG. 8. The balanced-armature transducer 25 is operated in a closed box system 14 where the enclosure has a defined leakage 16. The input current i and voltage u at the terminals of the transducer are measured by using a sensor 13 and are supplied to the inputs 17 and 19 of a parameter measurement system 15 generating the optimal parameter vector P at the measurement output 23. The parameter vector P is supplied to the parameter input 21 of the controller 29 as well as to the input of a diagnostic system 22 generating diagnostic information (e.g. offset $x_{off}$ of the armature). The controller receives the input signal v at the control input 31 and generates the control output signal u transferred via the DA-converter 27 and a power amplifier 63 to the transducer 25.

Figure 9:
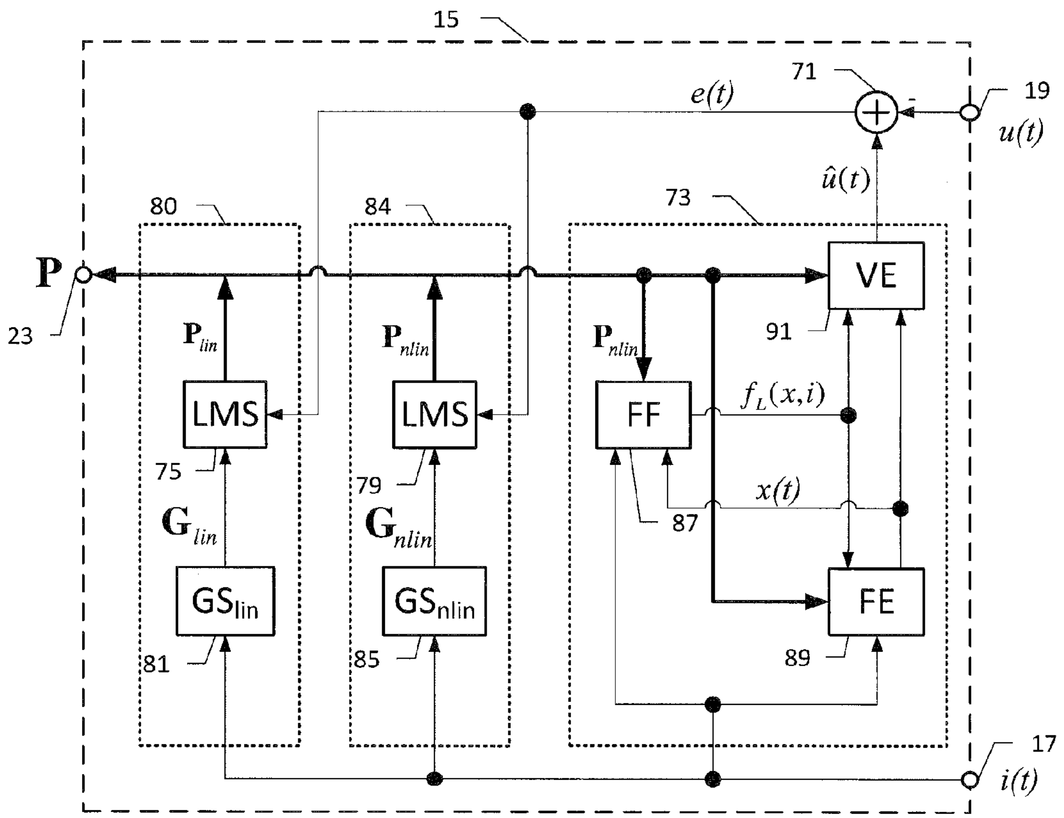
FIG. 9 shows an embodiment of the detector in accordance with the present invention.

According to the invention an optimal estimate of the parameter vector P is determined in the measurement system 15 as shown in FIG. 9 by calculating the error signal $$e=\hat{u}-u \tag{41}$$

in the model evaluation system 71 as the difference between the voltage a predicted by the nonlinear model 73 and measured voltage u.

Two parameter estimators 80, 84 determine optimal parameters $P_{lin}$, $P_{nlin}$ in vector P by searching for the minimum of the mean squared error $$C=MSE=E\{e(t)^2\}. \tag{42}$$

This objective can be accomplished by the LMS-algorithm $$P[n]=P[n-1]+\mu e(t)G(t) \tag{43}$$

realized by systems 75, 79 with the step size μ and the gradient vector $$G(t)=[G_{lin}\ G_{nlin}]=\left[\frac{\partial u}{\partial P_1}\ \cdots\ \frac{\partial u}{\partial P_j}\ \cdots\ \frac{\partial u}{\partial P_J}\right]. \tag{44}$$

generated in the gradient systems 81, 85 by using input current i.

The nonlinear model 73 comprises a first subsystem 91 generating the voltage û in accordance with Eq. (34) and provides this value to the non-inverting input of the model evaluation system 71. A second subsystem 89 generates the position $$x=\left(\frac{L_e(x_s,0)}{\lambda}f_L(x,i)i-(K(x)-K(0))x+\frac{L(x_s,0)}{\lambda^2}f_L(x,i)(x-x_s)\right)*L^{-1}\left[\frac{1}{Z_m(s)s}\right] \tag{45}$$

in accordance with Eq. (35) and supplies this signal to subsystems 87, 91. The third subsystem 87 generates the instantaneous value of the flux function $f_L(x,i)$ in accordance with Eq. (19) using the parameter $P_{mag}$ and supplies this value to the subsystems 89 and 91. The measured current i is the input of the subsystems 87 and 89.

Figure 10:
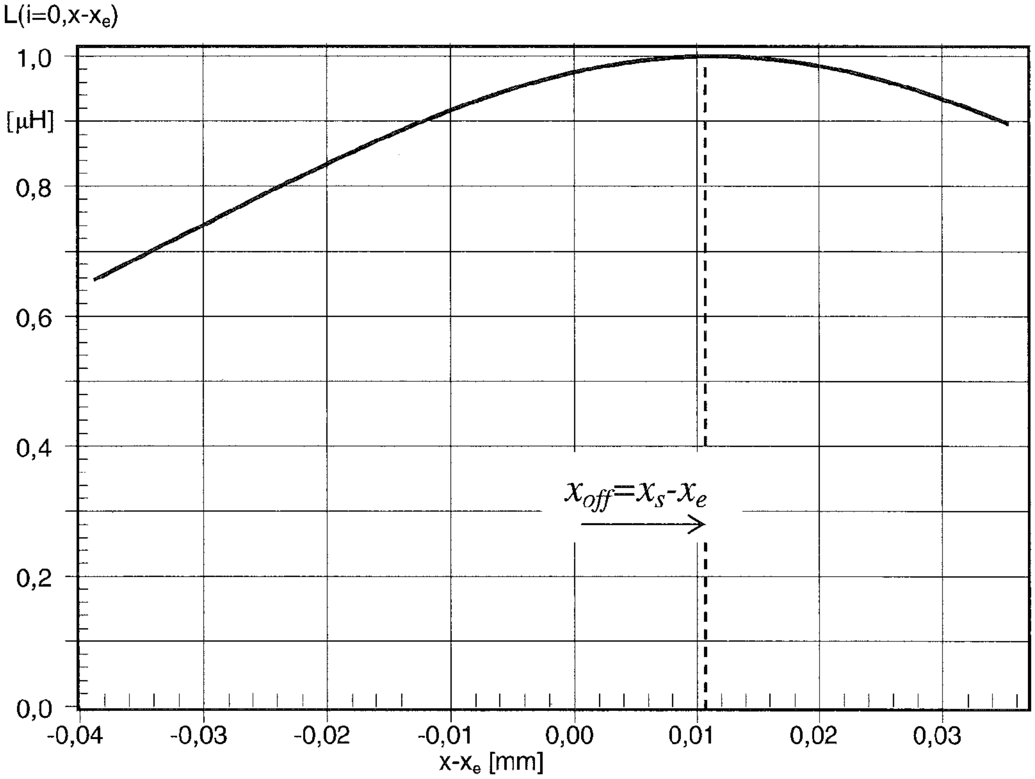
FIG. 10 shows the identified nonlinear inductance L(x,i=0) as a function of the position x of the armature.
Figure 11:
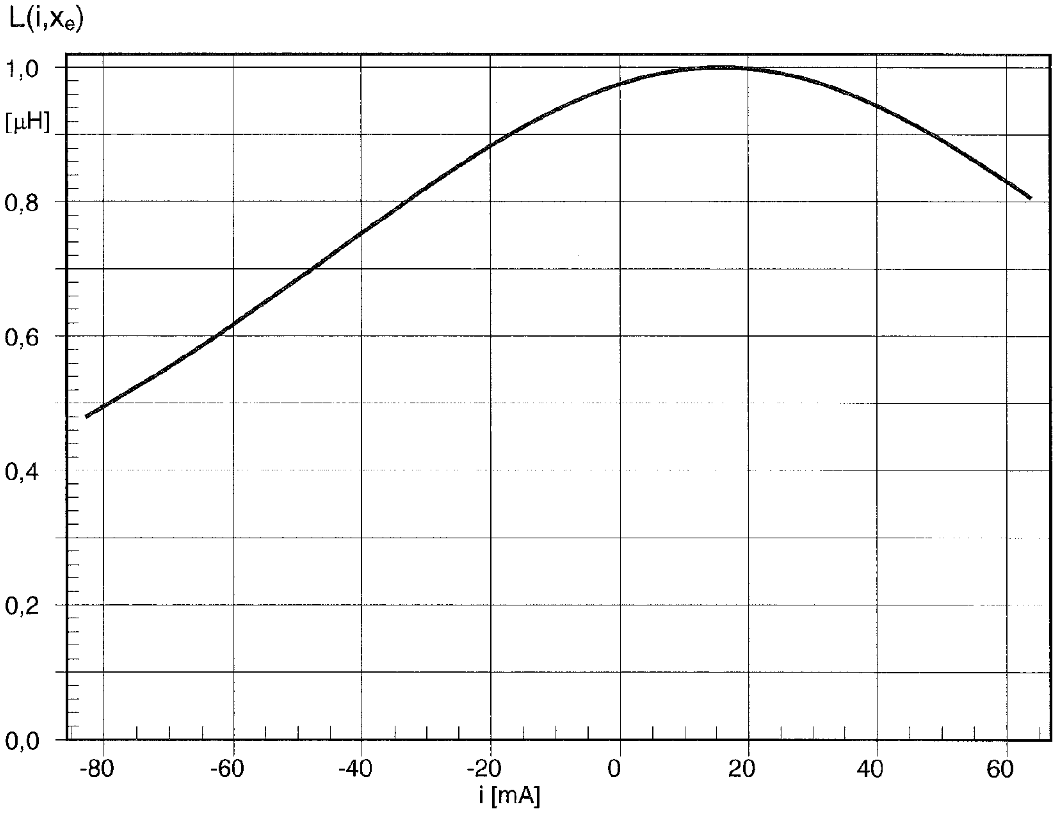
FIG. 11 shows the identified nonlinear inductance $L(x_e,i)$ as a function of the input current i at the equilibrium point $x_e$ of the armature.

FIG. 10 shows the nonlinear inductance $L(i=0,x-x_e)$ versus displacement $x-x_e$ from the equilibrium position $x_e$ with input current i=0 calculated by using parameters $P_{mag}$. The position at maximum inductance corresponds to the symmetry point $x_s$. The decay of the inductance for larger displacements agrees with the decrease of the electrical input impedance at higher frequencies as shown in FIG. 4 and FIG. 5. FIG. 11 and shows the dependency of the inductance $L(i, x_e)$ versus input current i at the equilibrium point $x_e$.

According to the invention a diagnostic system 22 derives information from the identified parameter vector P which is the basis for improving the electro-magnetic transducer during development and manufacturing. The symmetry point $x_s$ in vector $P_{mag}$ reveals the optimal rest position of the armature and the offset $x_{off}=x_s-x_e$ to the equilibrium position $x_e$. If the magnets 3, 5 have not been magnetized and the armature is at the initial rest position x=0 the sign and the amount of $x_s$ can be used to adjust the rest position of the mechanical suspension in one step. After adjusting the initial rest point x=0 of the armature to the symmetry point $x_s=0$ the equilibrium position $x_e=0$ with magnetized magnets will also stay at the initial rest point (if the transducer behaves stable).

Bifurcation and other unstable behavior can be avoided by ensuring the condition $$-K_{mm}(x,0)(x-x_s)<(K(x)-K(0))x+L^{-1}[Z_m(s)s]*x. \tag{46}$$

This condition can be realized by generating dominant saturation in the magnetic circuit according to Eq. (20) and/or sufficient restoring force of the mechanical suspension. The nonlinear stiffness variation in K(x)−K(0) of the suspension revealed by the coefficients $k_j$ in $P_{sus}$ can be used to stabilize the transducer and to generate a desired transfer characteristic. The parameters $s_k$ in vector $P_{mag}$ reveal the dominant nonlinearity in the denominator of Eq. (19) and parameter $s_x$ shows which state variable (current i or position x) has the largest influence on this process. This information can be used to find the optimal cross section area $A_a$ of the armature 1 where the nonlinear saturation compensates the effect of the geometrical nonlinearity.

According to a further objective of the invention the identified parameter vector P is also used to compensate actively undesired nonlinearities of the electro-magnetic transducer by using an electric controller 29 and generating a desired transfer behavior of the overall system (controller 29+transducer 25).

Figure 12:
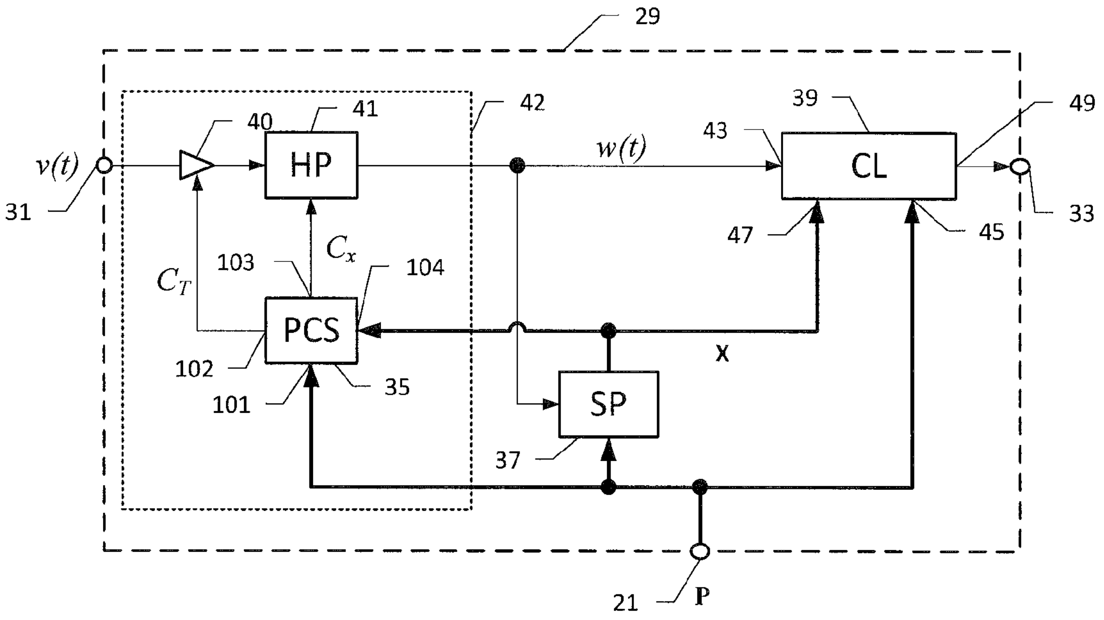
FIG. 12 shows an embodiment of the controller in accordance with the present invention.

FIG. 12 shows an embodiment of the controller in accordance with the invention. The input signal v at input 31 is supplied via a protection system 42 to the input 43 of the control law system 39 generating the control output signal u at control output 49. The controller also contains a state predictor 37 generating the state vector x which comprises position x, current i and other state variables of the transducer.

The linearization of the armature movement will also give a linear acoustical output of the transducer while assuming that the sound radiation by the diaphragm 8 is a linear process. Thus, the following linear relationship $$x=\left(w-\frac{d(L(x_s,0)i_l)}{dt}\right)*L^{-1}\left\{\frac{T(x_s,0)}{(R_eZ_m(s)+T(x_s,0)^2)s}\right\}+x_s \tag{47}$$

between controller input signal w input and position x of the armature requires a particular nonlinear transfer characteristic of the control law system 39 defined by $$u=\alpha(x)[w+\beta(x)] \tag{48}$$

with the control gain $$\alpha(x)=\frac{T(x_s,0)}{T(x,i)}=\frac{1}{f_L(x,i)} \tag{49}$$

and the control additive $$\beta(x)=\left(\frac{T(x,i)^2}{T(x_s,0)^2}-1\right)T(x_{off},0)v-\frac{d(L(x_s,0)i_l)}{dt}+\frac{R_e}{T(x_s,0)}((K(x)-K(0))x+K_{mm}(x,i)(x-x_s))+ \tag{50}$$

-continued $$\frac{T(x,i)}{T(x_s,0)}\frac{d(L(x,i)i)}{dt} = (f_L(x,i)^2-1)\frac{L(x_s,0)}{\lambda}v - \frac{d(L(x_s,0)i_l)}{dt} + \frac{R_e\lambda}{L(x_s,0)}\left((K(x)-K(0))x - \frac{L(x_s,0)}{\lambda^2}f_L(x,i)(x-x_s)\right) + f_L(x,i)\frac{d(L(x_s,0)f_L(x,i)i)}{dt}.$$

Figure 13:
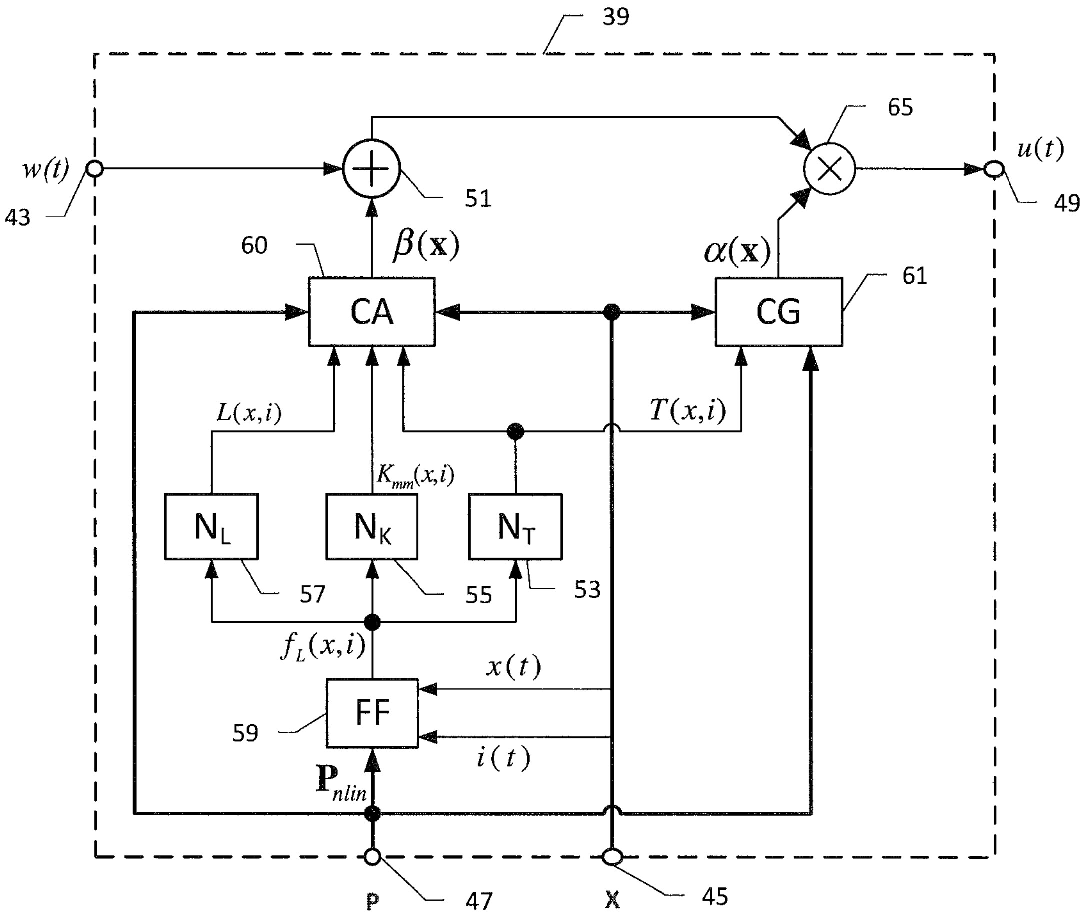
FIG. 13 shows an embodiment of the control law in accordance with the present invention.

FIG. 13 shows an embodiment of the control law system 39 comprising an adder 51 and a multiplier 65 in accordance with Eq. (48), an additive sub-controller 60 in accordance with Eq. (50) and a multiplicative sub-controller 61 in accordance with Eq. (49). A nonlinear subsystem 59 identical with the second subsystem 89 is provided with the nonlinear parameter $P_{mag}$ from input 47 and with the armature position x and current i from the state vector input 45 and generates the instantaneous value of the flux function $f_L(x,i)$ supplied to the transfer systems 57, 55 and 53. The instantaneous inductance L(x,i) generated in 57 in accordance with Eq. (22) and the magnetic stiffness $K_{mm}(x,i)$ in 55 in accordance with Eq. (30) is supplied to the additive sub-controller 60. The transduction factor T(x,i) generated in 53 in accordance with Eq. (24) is supplied to both sub-controllers 60 and 61.

The state vector $x=[x,v,i_l,i]^T$ generated in state expander 37 also comprises the velocity $$v = \frac{dx}{dt}, \tag{51}$$

the linear current $i_l$ generated by $$i_l = L^{-1}\left\{\frac{Z_m(s)s}{T(x_s,0)}\right\}*x = L^{-1}\left\{\lambda\frac{Z_m(s)s}{L(x_s,0)}\right\}*x \tag{52}$$

and the predicted nonlinear current generated by $$i = \frac{T(x_s,0)}{T(x,i)}\left\{i_l + \frac{(K(x)-K(0))x + K_{mm}(x,i)(x-x_s)}{T(x_s,0)}\right\} = \frac{1}{f_L(x,i)}\left\{i_l + \lambda\frac{K(x)-K(0)}{L(x_s,0)}x - f_L(x,i)\frac{(x-x_s)}{\lambda}\right\}. \tag{53}$$

The controller 29 also compensates for the offset $x_{off}$ actively and ensures that the equilibrium point $x_e$ is identical with the symmetry point $x_s$ of the magnetic circuit. This requires that the power amplifier 27 is DC-coupled to transfer the DC component generated in the controller 29 to the transducer 25. This ensures maximum excursion generated by the external stimulus w and a symmetrical limiting of armature at the upper and lower pole tips.

An unstable transducer as defined by Eq. (46) can also be stabilized by active control when the symmetry point $x_s$ is permanently updated using a high step size parameter μ in Eq. (43) to realize a short measurement time $T_m$. The step size parameter can be reduced if the electro-magnetic transducer 25 is operated in a sealed enclosure 14 having a small air leak 16 required to compensate for variation of the static air pressure. The additional stiffness of the enclosed air stabilizes the equilibrium point for a short time $\tau_B$ required by the air to pass the leak. If the measurement time $T_m$ is shorter than the time $\tau_B$ the active control can compensate any offset $x_{off}=x_s-x_e$ or instability of the armature. This technique makes it possible to reduce the stiffness K(x) of the mechanical suspension and to increase the acoustical output of the transducer in a closed box 14 at low frequencies.

According to the third objective of the invention the identified parameter vector P is also used to protect the electro-magnetic transducer against mechanical and thermal overload. The embodiment of the protection system 42 shown in FIG. 12 comprises a protection control system 35, an attenuator 40 connected in series to a high-pass filter 41. A control signal $C_T$ provided from the output 102 of the protection control system 35 attenuates all spectral components in signal w in the case of thermal overload. The control signal $C_x$ from the output 103 increases the cut-off frequency of the high-pass filter 41 and attenuates the low frequency components in the case of mechanical overload.

Figure 14:
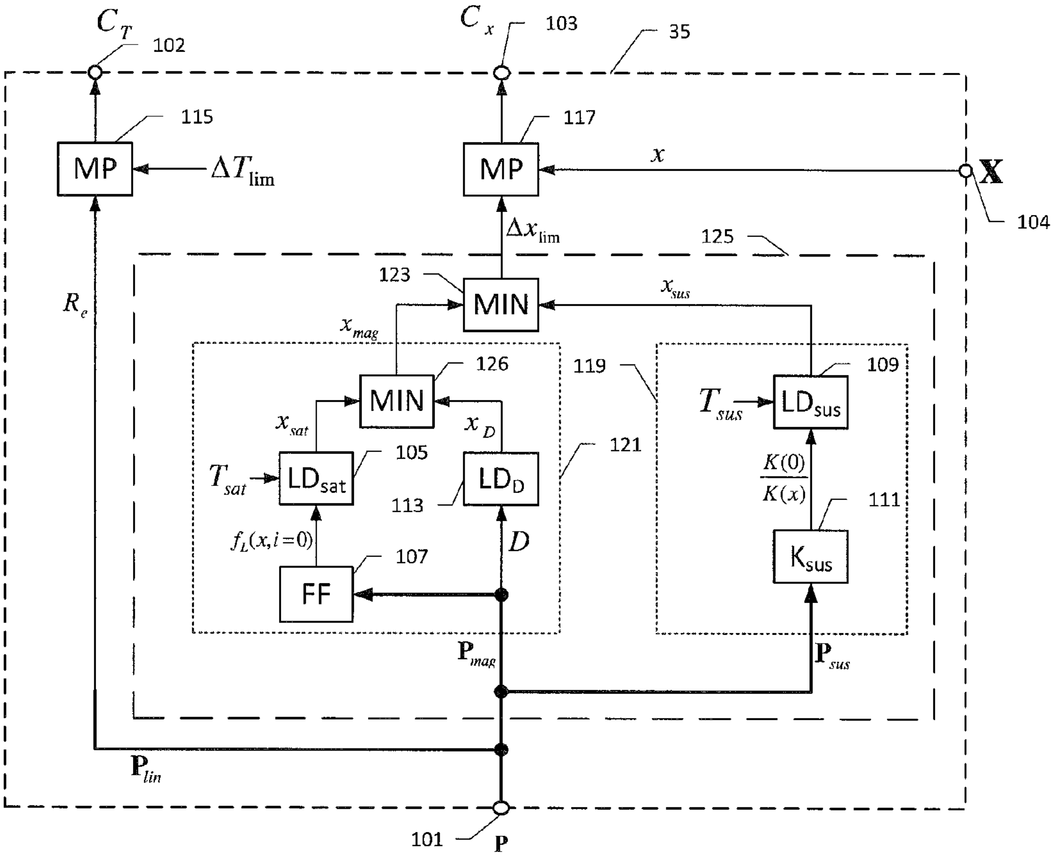
FIG. 14 shows an embodiment of the protection system in accordance with the present invention.

FIG. 14 shows an embodiment of the protection control system 35 which receives the state vector x at input 104 and the parameter vector P at input 101. The nonlinear modeling of the electrical circuit in Eq. (34) ensures an accurate estimation of the DC resistance $R_e(T_c)$ in the vector $P_{lin}$ which is a function of the instantaneous coil temperature $T_c$. Comparing the instantaneous value of $R_e(t)$ with the initial value $R_e(t=0)$ in the thermal control subsystem 115 reveals the increase of the coil temperature $\Delta T=T_c(t)-T_c(t=0)$. If the increase of the coil temperature exceeds a permissible limit value $\Delta T_{lim}$ the control signal $C_T$ attenuates the input signal v to prevent a thermal overload.

The instantaneous position x(t) of the armature generated in the state estimator 37 of the controller can also be used for providing a protection of the armature 1, suspension 6, driving pin 10, diaphragm 8 and other mechanical elements of the transducer. If the absolute value of the armature displacement $\lfloor x(t)-x_e\rfloor$ exceeds a permissible displacement limit $\Delta x_{lim}$ the mechanical control subsystem 117 activates the control signal $C_x$. The displacement limit $\Delta x_{lim}$ is determined by a working range detector 125 receiving the parameter vector P. The working range detector 125 comprises a minimum detector 113, a mechanical detector 119 and a magnetic detector 121.

The minimum detector 113 searching for the minimal value between limit $x_{mag}$ generated by a magnetic detector 121 and a limit $x_{sus}$ generated by a mechanical detector 119.

The magnetic detector 121 receives the parameters $P_{mag}$ and generates two sub-limits: The first sub-limit $x_{sat}$ is generated by system 105 using the nonlinear flux function $f_L(x,i)$ generated by nonlinear system 107 in accordance with Eq. (19) and searching for the displacement where the value of $f_L(x_{sat},i=0)=T_{sat}$ equals a permissible threshold $T_{sat}$. The second sub-limit $x_D$ is determined by system 113 which corresponds to parameter D in parameter vector $P_{mag}$ indicating the displacement where the armature hits the upper or lower pole tip. The minimum of $x_D$ and $x_{sat}$ gives the limit $x_{mag}$.

The mechanical detector 119 receives the parameters $P_{sus}$ and generates the relative stiffness function K(0)/K(x) of the suspension 6 in the nonlinear system 111 using Eq. (36). The solver 109 searches for the limit $x_{sus}$ where the variation of the nonlinear stiffness $K(0)/K(x_{sus})=T_{sus}$ equals a permissible threshold $T_{sus}$.

The invention claimed is:

1. An arrangement for converting an input signal v(t) into an output signal p(t) and for generating a predefined transfer behavior between said input signal v(t) and said output signal p(t), the arrangement comprising:

an electro-magnetic transducer having a coil and a moving armature, a sensor, which is configured and arranged such to measure at least one state variable of said transducer and to generate a monitored signal (i(t)) representing said measured state variable;

a parameter measurement device, which is configured and arranged such to generate based on the monitored signal electro-magnetic parameter information P, wherein said parameter information P describes the following relationship $$u = R_e i + \frac{d(L(x, i)i)}{dt} + T(x, i)\frac{dx}{dt}$$

in which u denotes an electric input voltage of the electro-magnetic transducer, i denotes an input current of the electro-magnetic transducer, x denotes an instantaneous armature position of the moving armature, $R_e$ denotes a DC resistance of the coil, T(x,i) denotes a nonlinear electromagnetic transduction factor of the transducer and L(x,i) denotes a nonlinear coil inductance of the coil which is depends on input current i and instantaneous armature position x.

2. The arrangement of claim 1, further comprising a nonlinear device, which is configured and arranged such to generate based on said parameter information P a flux function $f_L(x,i)$ describing the nonlinear dependency of the magnetic flux $\phi_a$ in said moving armature (1) on armature position x and input current i, wherein said flux function $f_L(x,i)$ considers the saturation or hysteresis of the magnetic flux $\phi_a$;

said arrangement further comprising at least one of the following elements:

an inductance device, which is configured and arranged such to generate a nonlinear dependency of said coil inductance L(x, i) on instantaneous armature position x and input current i by scaling said flux function $f_L(x,i)$ with a linear inductance parameter $L(x_s,0)$, which describes said coil inductance L(x, i) at the symmetry point $x_s$ and zero input current i=0;

a transduction factor system, which is configured and arranged such to generate a nonlinear dependency of said transduction factor T(x, i) on instantaneous armature position x and input current i by scaling said flux function $f_L(x,i)$ with a linear transduction parameter $T(x_s,0)$, which describes said transduction factor T(x, i) at the symmetry point $x_s$ and zero input current i=0;

a magnetic stiffness system, which is configured and arranged such to generate a nonlinear dependency of said electro-magnetic stiffness $$K_{mm}(x,i) = -K_{mm}(x_s,0)f_L(x,i)$$

on instantaneous armature position x and input current i by scaling said flux function $f_L(x,i)$ with a linear stiffness parameter $K_{mm}(x_s,0)$, which describes the electro-magnetic stiffness $K_{mm}(x,i)$ at the symmetry point $x_s$ and zero input current i=0, wherein electro-magnetic stiffness $K_{mm}(x,i)$ and a mechanical stiffness K(x) describes the equilibrium of the mechanical forces of said transducer (25) for zero input current i=0.

3. The arrangement of claim 2, wherein said parameter information P describes the nonlinear dependency of the mechanical stiffness K(x) of the mechanical suspension on armature position x, wherein the mechanical stiffness K(x) is the fraction of the total stiffness $K(x)+K_{mm}(x,i)$ which is independent of the magnetic flux $\phi_a$ in the armature.

4. The arrangement of claim 1, wherein said parameter measurement system is configured to receive an electric signal of said transducer, wherein said electric signal is different from said monitored signal;

said parameter measurement system further comprises:

a nonlinear model of the electro-magnetic transducer, which is configured and arranged to generate based on said monitored signal and said parameter information P an estimated state signal u' describing the electric signal;

a model evaluation system, which is configured and arranged to generate an error signal e describing the deviation between said estimated state signal u' and said electric signal; and an estimator, which is configured and arranged to generate an update of said parameter information P by minimizing said error signal e.

5. The arrangement of claim 3, further comprising a controller, which is configured and arranged to generate based on said input signal v and said parameter information P an electric input signal supplied to said transducer; wherein said controller comprises a state predictor, which is configured and arranged to generate based on said parameter information P a state vector x containing the instantaneous armature position x and input current i;

a protection system, which is configured and arranged to generate based on said state vector x information describing mechanical or thermal overload of said transducer and to use said information for transforming said input signal v into a modified signal w; and a control law system, which is configured and arranged to generate based on said modified signal w said electric input signal by using said state vector x and said parameter information P.

6. The arrangement of claim 5, wherein said control law system comprises an additive sub-controller, which is configured and arranged to generate based on said parameter information P and said state vector x a control additive $\beta(x)$;

a multiplicative sub-controller, which is configured and arranged to generate based on said nonlinear characteristic of said transduction factor T(x,i) and said state vector x a control gain $\alpha(x)$;

an adder, which is configured and arranged to generate a summed signal $w+\beta(x)$ by adding said control additive $\beta(x)$ to said modified signal w; and a multiplier, which is configured and arranged to generate said electric input signal u by multiplying said summed signal $w+\beta(x)$ with said control gain $\alpha(x)$.

7. The arrangement of claim 5, wherein said protection system comprises a protection control system, which is configured and arranged to generate based on said state vector x and said parameter information P at least one protection control signal; and a controllable transfer element, which is configured and arranged to generate based on input signal v and said protection control signal said modified signal w.

8. The arrangement of claim 7, wherein said protection control system further comprises a thermal control subsystem, which is configured and arranged to generate based on the instantaneous DC resistance $R_e$ of said coil provided in said parameter information P a thermal control signal $C_T$, wherein said thermal control signal $C_T$ attenuates components of said input signal v if the increase of the coil temperature $\Delta T$ exceeds a predefined threshold $\Delta T_{lim}$.

9. The arrangement of claim 7, wherein said protection control system further comprises a working range detector, which is configured and arranged to generate based on said parameter information P a displacement limit $\Delta x_{lim}$, which describes the maximal amplitude of the displacement of the armature from its rest position;

a mechanical control subsystem, which is configured and arranged to generate based on said displacement limit $\Delta x_{lim}$ and on said state vector x a mechanical control signal $C_x$, wherein said protection control signal $C_x$ attenuates components of said input signal v if the instantaneous displacement of the armature position x provided by said state vector x exceeds said predefined displacement limit $\Delta x_{lim}$.

10. The arrangement of claim 9, wherein said working range detector comprises at least one of the following elements:

a magnetic detector, which is configured and arranged to generate based on said parameter information P a magnetic limit value $x_{mag}$, wherein said magnetic limit value $x_{mag}$ considers at least one of:

the total length of an air gap of said transducer, other geometrical properties of said transducer, properties of the magnetic material used in said transducer;

a mechanical detector, which is configured and arranged to generate a mechanic limit value $x_{sus}$ based on said mechanical stiffness K(x) in the parameter information P describing the nonlinearities of the mechanical suspension;

a minimum detector, which is configured and arranged to assign the smaller value of said magnetic limit value $x_{mag}$ and said mechanic limit value $x_{sus}$ to said displacement threshold $\Delta x_{lim}$.

11. The arrangement of claim 5, wherein said controller generates a DC signal in said electric input signal u, wherein said DC signal is configured and arranged to adjust and stabilize the equilibrium position x of the armature; and said arrangement further comprises a power amplifier, which is configured and arranged to transfer the DC signal to the input of said transducer.

12. The arrangement of claim 11, further comprising a membrane, which is connected with said armature;

an enclosure, which is configured and arranged to compress air by the movement of the membrane, wherein the enclosure contains a predefined leakage to compensate for changes of the static ambient air pressure and to generate a time constant $\tau_B$ required by the enclosed air to pass the leakage which is larger than a measurement time $T_m$ required to generate the DC signal.

13. The arrangement of claim 1, further comprising a diagnostic system, which is configured and arranged to generate based on said parameter information P diagnostic information for correcting the transfer behavior of said transducer by adjusting the mechanical system or improving the design or controlling the manufacturing process of said transducer.

14. A method for converting an input signal v into an output signal p by using an electro-magnetic transducer based on a coil and a moving armature and generating a predefined transfer behavior between said input signal v and said output signal p, the method comprising:

measuring at least one state variable of said transducer;

generating a monitored signal based on the measured state variable of said transducer;

generating electro-magnetic parameter information P based on the monitored signal, wherein said parameter information P describes the relationship $$u = R_e i + \frac{d(L(x, i)i)}{dt} + T(x, i)\frac{dx}{dt}$$

in which u denotes an electric input voltage of the electromagnetic transducer, i denotes an input current of the electromagnetic transducer, x denotes an instantaneous armature position of the moving armature, $R_e$ denotes a DC resistance of the coil, T(x,i) denotes a nonlinear electromagnetic transduction factor of the transducer and L(x,i) denotes a nonlinear coil inductance of the coil which is depends on input current i and instantaneous armature position x.

15. The method of claim 14, further comprising the step of generating a flux function $f_L(x,i)$ by using said parameter information P, wherein said flux function $f_L(x,i)$ describes the nonlinear dependency of the magnetic flux $\phi_a$ in said armature on armature position x and current i and considers the saturation or hysteresis of the magnetic flux $\phi_a$;

further comprising at least one of the following steps:

generating a nonlinear dependency of said coil inductance $$L(x,i)=L(x_s,0)f_L(x,i)$$

on instantaneous armature position x and input current i by scaling said flux function $f_L(x,i)$ with a linear inductance parameter $L(x_s,0)$, which describes said inductance at the symmetry point $x_s$ and for zero input current i=0;

generating a nonlinear dependency of said transduction factor $$T(x,i)=T(x_s,0)f_L(x,i)$$

on instantaneous armature position x and input current i by scaling said flux function $f_L(x,i)$ with a linear transduction parameter $T(x_s,0)$, which describes said transduction factor at the symmetry point $x_s$ and for zero input current i=0;

generating a nonlinear dependency of an electro-magnetic stiffness $$K_{mm}(x,i)=K_{mm}(x_s,0)f_L(x,i)$$

on instantaneous armature position x and input current i by scaling said flux function $f_L(x,i)$ with a linear stiffness parameter $K_{mm}(x_s,0)$, which describes the electro-magnetic stiffness $K_{mm}(x,i)$ at the symmetry point $x_s$ and zero input current i=0, wherein electro-magnetic stiffness $K_{mm}(x,i)$ and mechanical stiffness K(x) describe the equilibrium of the mechanical forces of said transducer (25) for zero input current i=0.

16. The method of claim 15, wherein said parameter information P describes the nonlinear dependency of the mechanical stiffness K(x) of the mechanical suspension on armature position x, wherein the mechanical stiffness K(x) is the fraction of the total stiffness $K(x)+K_{mm}(x)$ which is independent of the magnetic flux $\phi_a$ in the armature.

17. The method of claim 14, further comprising exciting said transducer with an electric signal u wherein said electric signal u is different from said monitored signal;

assigning initial values to that parameter information P;

generating an estimated state signal u' based on said monitored signal and said parameter information P by using a nonlinear model of the electro-magnetic transducer, wherein said estimated state signal u' describes the electric signal u;

generating an error signal e describing the deviation between said estimated state signal u' and said electric signal u; and generating an update of said parameter information P by minimizing said error signal e.

18. The method of claim 16, further comprising providing a compensation signal v;

generating protection information indicating a mechanical or thermal overload of said transducer;

generating a modified signal w based on said input signal v, said protection information and said parameter information P, wherein components of the modified signal w are attenuated if said protection information indicate a thermal or mechanical overload of said transducer;

generating a state vector x based on said modified signal w and said parameter information P, wherein said state vector x describes the instantaneous armature position x and input current i of said transducer;

generating said electric input signal u based on said modified signal w by using said state vector x and said parameter information P;

supplying said electric input signal u to the electrical input of said transducer.

19. The method of claim 18, generating a control additive β(x) based on said parameter information P and said state vector x;

generating a control gain α(x) based on said nonlinear characteristic of said transduction factor T(x,i) and said state vector x;

generating a summed signal w+β(x) by adding said control additive β(x) to said modified signal w; and generating said electric input signal u by multiplying said summed signal w+β(x) with said control gain α(x).

20. The method of claim 18, further comprising generating at least one protection control signal by using said state vector x and said parameter information P; and generating said modified signal w by attenuating spectral components of the input signal v if said protection control signal indicate a thermal or mechanical overload of the transducer.

21. The method of claim 20, further comprising measuring the initial DC resistance $R_e$(t=0) of said transducer by using an electric input signal u at low amplitudes which causes negligible heating of the coil;

measuring the instantaneous DC resistance $R_e$(t) of said transducer by using an arbitrary electric input signal u causing a heating of the coil;

generating the increase of the coil temperature ΔT based on said initial DC resistance $R_e$(t=0) and instantaneous DC resistance $R_e$(t);

generating a thermal control signal $C_T$ based on the increase of the coil temperature ΔT; and attenuating components of said input signal v by using the thermal control signal $C_T$ if the increase of the coil temperature ΔT exceeds a predefined threshold $\Delta T_{lim}$.

22. The method of claim 20, further comprising generating a displacement limit $\Delta x_{lim}$ based on said parameter information P, which describes the maximal amplitude of the displacement of the armature from its rest position;

generating said protection control signal $C_x$ based on said displacement limit $\Delta x_{lim}$ and on said state vector x, wherein said protection control signal $C_x$ attenuates components of said input signal v if the instantaneous displacement of the armature position x provided by said state vector x exceeds said predefined displacement threshold $\Delta x_{lim}$.

23. The method of claim 22, further comprising generating a magnetic limit value $x_{mag}$ based on said parameter information P, wherein said magnetic limit value $x_{mag}$, wherein said magnetic limit value $x_{mag}$ considers at least one of:

the total length of an air gap of said transducer, other geometrical properties of said transducer, properties of the magnetic material used in said transducer;

generating a mechanic limit value $x_{sus}$ based on said mechanical stiffness K(x) in the parameter information P, wherein mechanic limit value $x_{sus}$ considers the nonlinearities of the mechanical suspension; and assigning the smaller value of said magnetic limit value $x_{mag}$ and said mechanic limit value) $x_{sus}$ to said displacement threshold $\Delta x_{lim}$.

24. The method of claim 18, further comprising generating a DC signal in said electric input signal u based on parameter information P;

transferring said DC signal to the electrical input of said transducer;

shifting the equilibrium point $x_e$ of the armature by using said DC signal to a symmetry point $x_s$ or to any other predefined position; and stabilizing the equilibrium point $x_e$ of the armature by updating permanently said parameter information P and generating an updated DC signal.

25. The method of claim 14, further comprising based on said parameter information P generating diagnostic information for correcting the transfer behavior of said transducer, wherein said diagnostic information contain at least one of the following parameters:

offset parameter $x_{off}=x_s-x_e$, describing the deviation of the equilibrium point $x_e$ from the symmetry point x wherein said equilibrium point $x_e$ describes the position of the armature where the sum of magnetic and mechanic static forces equals zero, and the symmetry point $x_s$ describes the position of the armature where the transduction parameter T(x,i) shows the lowest asymmetry;

saturation parameter, describing the saturation of the magnetic flux and the influence of the armature position x and input current i;

nonlinear stiffness K(x), describing the properties of the mechanical suspension of the armature;

based on the diagnostic information correcting the design or manufacturing process of said transducer by at least one of the following methods:

shifting the armature to the optimum rest position by using offset parameter which indicates the direction and distance to the optimum;

selecting the material of the armature and other magnetic transducer components by using the information provided by said saturation parameter;

generating the optimum shape of the armature and other magnetic transducer components by using the information provided by said saturation parameter;

generating the optimum shape of the mechanical system by using the information provided by the nonlinear stiffness K(x).

* * * * *